United States Patent
Kawamura

(10) Patent No.: US 10,839,871 B2
(45) Date of Patent: *Nov. 17, 2020

(54) APPARATUSES AND METHOD FOR REDUCING SENSE AMPLIFIER LEAKAGE CURRENT DURING ACTIVE POWER-DOWN

(71) Applicant: Micron Technology, Inc., Boise, ID (US)

(72) Inventor: Christopher Kawamura, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/783,086

(22) Filed: Feb. 5, 2020

(65) Prior Publication Data

US 2020/0176034 A1    Jun. 4, 2020

Related U.S. Application Data

(63) Continuation of application No. 16/009,806, filed on Jun. 15, 2018, now Pat. No. 10,566,036.

(51) Int. Cl.
| | | |
|---|---|---|
| *G11C 7/12* | (2006.01) | |
| *G11C 5/14* | (2006.01) | |
| *G11C 7/08* | (2006.01) | |
| *G11C 7/06* | (2006.01) | |
| *G11C 8/10* | (2006.01) | |

(52) U.S. Cl.
CPC ............ *G11C 7/08* (2013.01); *G11C 5/148* (2013.01); *G11C 7/062* (2013.01); *G11C 8/10* (2013.01)

(58) Field of Classification Search
CPC ....... G11C 11/4076; G11C 7/22; G11C 7/222; G11C 7/109; G11C 7/225; G11C 7/08; G11C 7/12; G11C 8/18; G11C 11/4085; G11C 11/418

See application file for complete search history.

(56) References Cited

U.S. PATENT DOCUMENTS

| | | |
|---|---|---|
| 5,949,729 A | 9/1999 | Suyama et al. |
| 7,724,594 B2 | 5/2010 | Xi et al. |
| 8,068,379 B1 | 11/2011 | Takahashi et al. |
| 10,236,036 B2 | 3/2019 | Ingalls et al. |
| 10,566,036 B2 * | 2/2020 | Kawamura ............ G11C 8/10 |
| 2003/0016059 A1 | 1/2003 | Lee et al. |
| 2004/0090851 A1 | 5/2004 | Tanzawa et al. |
| 2005/0265096 A1 | 12/2005 | Obara et al. |
| 2005/0270889 A1 | 12/2005 | Sekiguchi et al. |
| 2012/0250437 A1 | 10/2012 | Nagata |
| 2013/0201765 A1 | 8/2013 | Cho et al. |

(Continued)

FOREIGN PATENT DOCUMENTS

WO     2018208445 A1    11/2018

*Primary Examiner* — Hien N Nguyen
(74) *Attorney, Agent, or Firm* — Dorsey & Whitney LLP

(57) ABSTRACT

Apparatuses and methods for operation of a sense amplifier during a power-down operation. The example apparatus may include a sense amplifier including of a transistor coupled between a digit line and a gut node of the sense amplifier. While a wordline coupled to a memory cell is activated, in response to entering a power-down mode, the transistor is disabled to decouple a digit line coupled to the memory cell from the gut node, which reduces leakage current in the sense amplifier.

20 Claims, 7 Drawing Sheets

(56) References Cited

U.S. PATENT DOCUMENTS

2016/0307618 A1    10/2016   Kim
2017/0018295 A1     1/2017   Kim
2017/0236573 A1     8/2017   Kim
2019/0156869 A1     5/2019   Ingalls et al.
2019/0385649 A1    12/2019   Kawamura

* cited by examiner

APPARATUSES AND METHOD FOR REDUCING SENSE AMPLIFIER LEAKAGE CURRENT DURING ACTIVE POWER-DOWN

CROSS-REFERENCE TO RELATED APPLICATION(S)

This application is a continuation of U.S. patent application Ser. No. 16/009,806 filed Jun. 15, 2018 and issued as U.S. Pat. No. 10,566,036 on Feb. 18, 2020. The aforementioned application and patent are incorporated by reference herein, in their entirety, and for any purposes.

BACKGROUND

High data reliability, high speed of memory access, and reduced chip size are features that are demanded from semiconductor memory. In recent years, there has been an effort to further increase the speed of memories while simultaneously reducing power consumption. In some applications, memory may be placed in a power-down or standby state to reduce power consumption for a period of time. Memory operations may be suspended while the memory is in the power-down or standby state. In some examples, to reduce a transition to normal operation, the memory suspends some portions of the memory in high voltage states. One side effect of suspending some circuitry at a higher voltage state may include unintended leakage current through portions of the circuitry. The leakage current may cause the memory to consume additional power.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
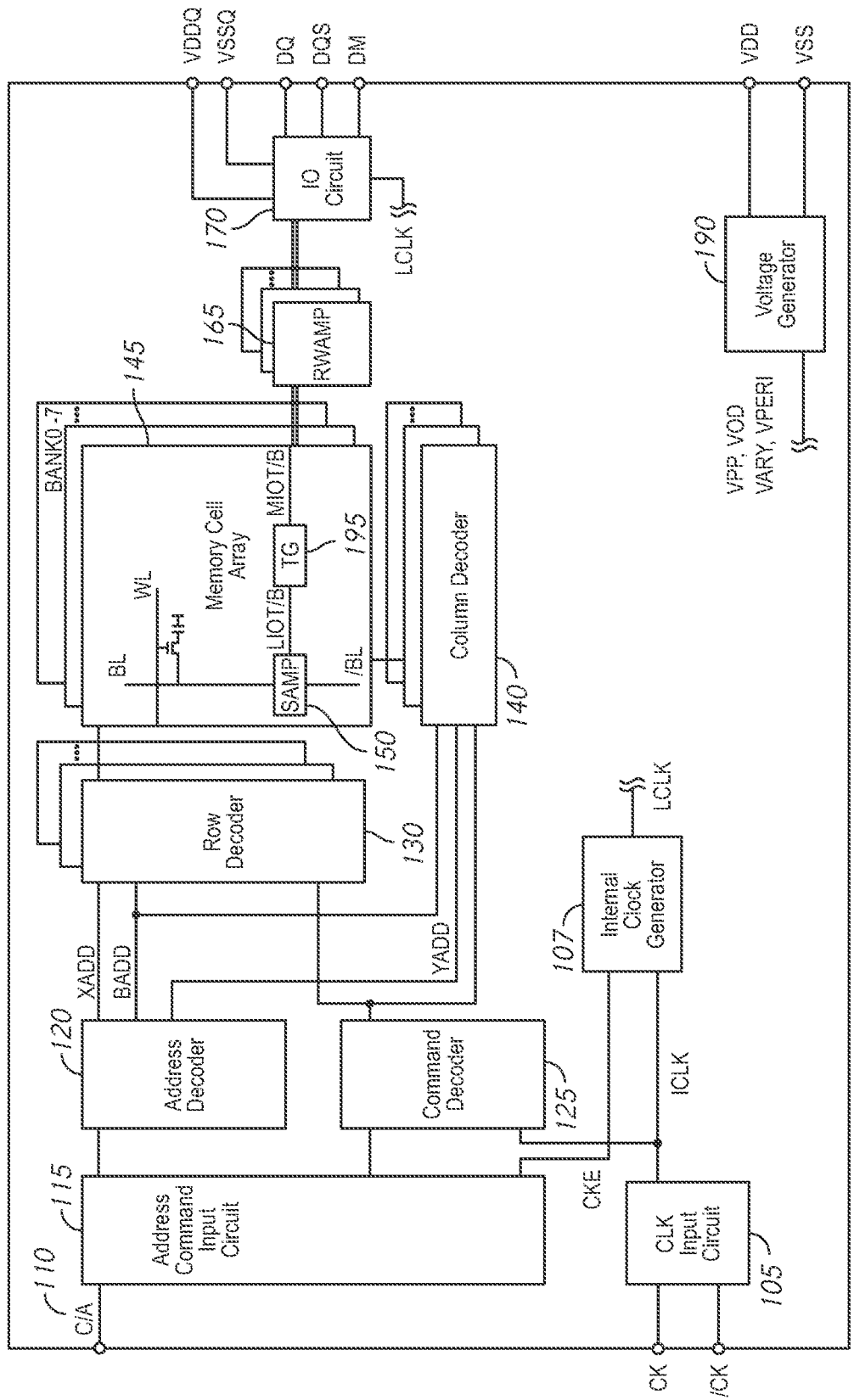
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that are configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of wordlines WL, a plurality of bit lines BL, and a plurality of memory cells MC arranged at intersections of the plurality of wordlines WL and the plurality of bit lines BL. The selection of the wordline WL for each bank BANK0-N is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof. In some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195). In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variance between circuit components introduced during fabrication (e.g., process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing bit lines BL and /BL coupled to the sense amplifiers 150 using internal nodes of the sense amplifier 150 that are configured to provide sensed data to an output (e.g., gut nodes). The bias of the bitlines BL and /BL may be based on threshold differences between at least two circuit components (e.g., transistors) of the sense amplifier 150.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. For example, the internal command signals may include a row command signal to select a wordline, or a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the JO circuit 170. The JO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

In some examples, the CKE signal may be used to place the semiconductor device in a power-down or standby state. For example, a power-down will occur if CKE is registered LOW, which may be in response to a NOP (no operation) or command inhibit instruction (e.g., a deselect command), when no memory accesses are in progress. If power-down occurs when all of the banks BANK0-N of the memory cell array 145 are idle, the semiconductor device 100 may be in a "precharge power-down." If the power-down occurs when there is a row (e.g., wordline WL set to a high voltage, such as the VARY voltage) active (e.g., in response to receipt of an ACTivate command) in any of the banks BANK0-N of the memory cell array 145, the semiconductor device 100 may be in an active power-down mode. The current consumed during the power-down states depends on whether the memory is in a precharge power-down or an active power-down mode of operation. The current consumed during the precharge power-down may be less than the current consumed during an active power-down mode. Further, because some circuitry of the memory array 145 continues to be driven at the high voltage (e.g., such as the digit lines BL and /BL), voltage differentials across some circuitry of the memory array 145 may result in leakage current and additional power consumption. To mitigate leakage current, the semiconductor device 100 may configure some portions of the memory array 145 to isolate some circuit components from the high voltages or may reduce voltage differentials across some circuit components. For example, circuitry of at least one of the sense amplifiers 150 may be subjected to the high voltage differentials by being coupled to an active digit line BL and /BL. Therefore, the command decoder 125, column decoder 140, row decoder 130, or other control circuitry of the semiconductor device 100 may set an isolation signal to an inactive state in response to entering the active power-down mode. The isolation signal being set to the inactive state may disable some circuitry of the sense amplifier 150 to decouple other portions of the sense amplifier 150 from the digit lines BL and /BL. In other examples, a low voltage (e.g., via the RNL signal) provided to the sense amplifier 150 may be increased from a reference or ground voltage to decrease a voltage differential experienced by circuitry of the sense amplifier 150 while in the active power-down mode. In some examples, both the isolation signal may be set to the inactive state and the low voltage may be increased in response to entering the active power-down mode. Performing one or both of setting the isolation signal to the inactive state and increasing the low voltage may reduce leakage current of the sense amplifier 150 during the active power-down state, and thereby reduce overall IDD3P current consumption. It is noted that the digit line isolation from some internal circuitry of the sense amplifiers 150 and increase of a low voltage to the sense amplifiers 150 may also be applied during in an active standby mode to reduce some of the IDD3N current caused by leakage in the sense amplifiers 150 without departing from the scope of the disclosure.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. In some examples, voltages P1 and P2 may be equal to a respective one of the internal voltages VPP, VOD, VARY, VPERI. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
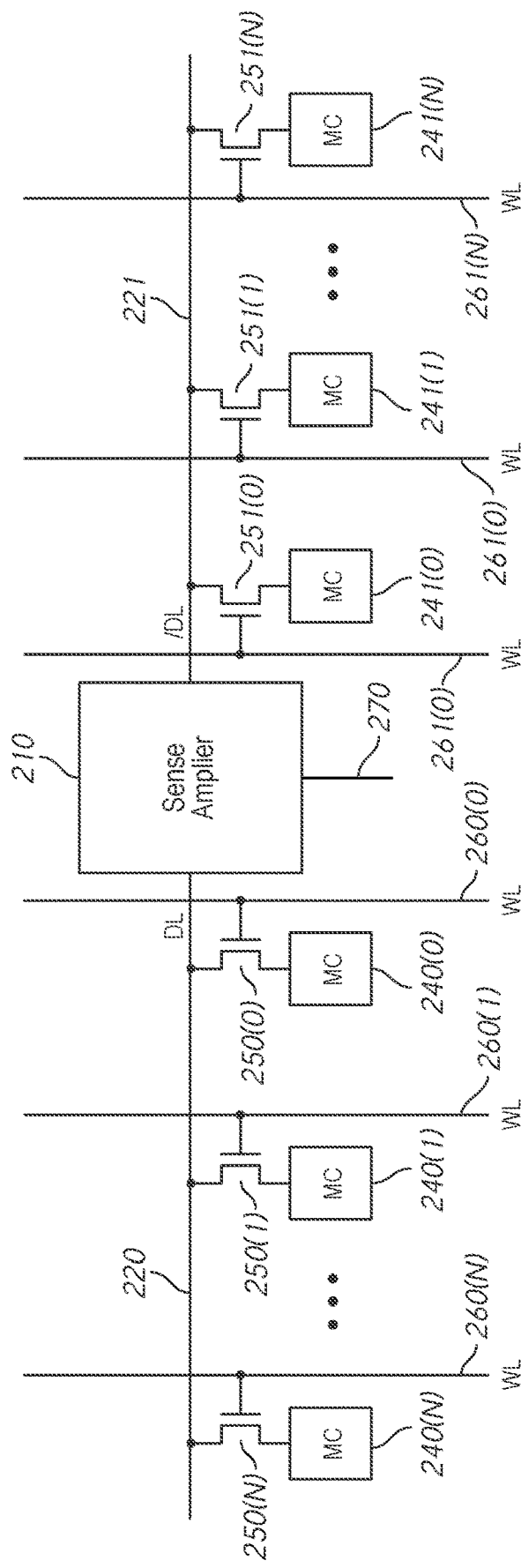
FIG. 2 is a schematic diagram of a sense amplifier and a pair of complementary digit lines in accordance with an embodiment of the disclosure.

FIG. 2 is a schematic diagram of a portion of a memory 200 that includes a sense amplifier 210 and a pair of complementary digit lines DL 220 and /DL 221 in accordance with an embodiment of the disclosure. As shown in FIG. 2, the sense amplifier 210 is coupled to the pair of true and complementary digit (or bit) lines DL 220 and /DL 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line /DL 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DL 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In operation, a memory cell of the memory cells 240(0)-(N) is coupled to the digit line DL 220 through the respective access device 250(0)-(N) in response to a respective wordline 260(0)-(N) becoming active. A data state stored by the memory cell is sensed and amplified by the sense amplifier 210 to drive the digit line DL 220 to a high or low voltage level corresponding to the sensed data state. The other digit line /DL 221 is driven to the complementary voltage level during the sense operation.

Similarly, a memory cell of the memory cells 241(0)-(N) is coupled to the digit line /DL 221 through the respective access device 251(0)-(N) in response to a respective wordline 261(0)-(N) becoming active. A data state stored by the memory cell is sensed and amplified by the sense amplifier 210 to drive the digit line /DL 221 to a high or low voltage level corresponding to the sensed data state. The other digit line DL 220 is driven to the complementary voltage level during the sense operation.

In some examples, the semiconductor device may enter a power-down or standby state. If the power-down occurs when there is a row (e.g., one of the wordlines WL 260(0)-(N) or 261(0)-(N)) is active (e.g., set to a high voltage, such as the VARY voltage) (e.g., in response to receipt of an ACTivate command), the semiconductor device 200 may be in an active power-down mode. During an active power-down mode, one of the digit lines DL 220 or /DL 221 may be set to the high voltage in response to the memory cell of the memory cells 240(0)-(N) and 241(0)-(N) coupled to the active wordline WL being coupled to the digit line DL 220 or /DL 221 via the corresponding access device 250(0)-(N) or 251(0)-(N). Because one of the digit lines DL 220 or /DL 221 is driven to the high voltage, some circuitry of the sense amplifier 210 may be subjected to high voltage differentials, which may result in leakage current and additional power consumption through the sense amplifier 210. To mitigate leakage current, the semiconductor device 100 may configure the sense amplifier 210 such that some circuit components are isolated from the high voltages or may reduce voltage differentials across some circuit components of the sense amplifier 210. For example, in response to entering the active power-down mode, an isolation signal may be set to an inactive state. The isolation signal being set to the inactive state may disable some circuitry of the sense amplifier 210 to decouple other portions of the sense amplifier 210 from the digit lines DL 220 and /DL 221. In other examples, a low voltage (e.g., via the RNL signal) provided to the sense amplifier 210 may be increased from a reference or ground voltage to decrease a voltage differential experienced by circuitry of the sense amplifier 210 while in the active power-down mode. In some examples, both the isolation signal may be set to the inactive state and the low voltage may be increased in response to entering the active power-down mode. Performing one or both of setting the isolation signal to the inactive state and increasing the low voltage may reduce leakage current of the sense amplifier 210 during the active power-down state, and thereby reduce overall IDD3P current consumption. It is noted that the actions of isolating the digit lines DL 220 and /DL 221 from some internal circuitry of the sense amplifier 210 and/or increasing the RNL signal voltage provided to the sense amplifier 210 may also be performed during in an active standby mode to reduce some of the IDD3N current caused by leakage in the sense amplifier 210 without departing from the scope of the disclosure.

Figure 3:
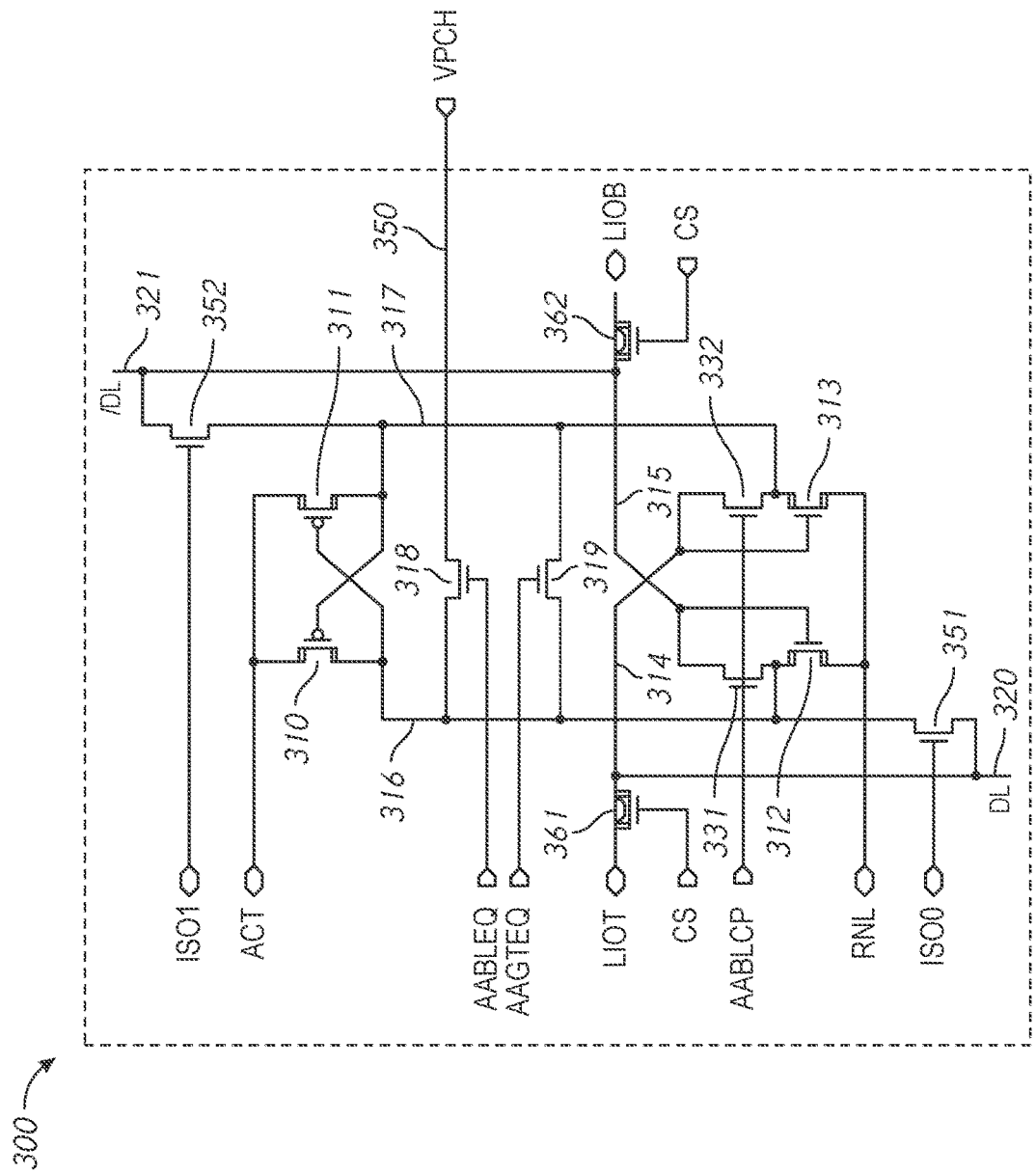
FIG. 3 is a circuit diagram of a sense amplifier in accordance with an embodiment of the disclosure.

FIG. 3 is a circuit diagram of a sense amplifier 300 in accordance with an embodiment of the disclosure. The sense amplifier 300 may be included as one or more of the sense amplifiers 150 of FIG. 1 and/or the sense amplifier 210 of FIG. 2.

The sense amplifier 300 may include first type of transistors (e.g. p-type field effect transistors (PFET)) 310, 311 having drains coupled to drains of second type of transistors (e.g., n-type field effect transistors (NFET) 312, 313, respectively. The first type of transistors 310, 311 and the second type of transistors 312, 313 form complementary transistor inverters including a first inverter including the transistors 310 and 312 and a second inverter including the transistors 311 and 313. The first type of transistors 310, 311 may be coupled to a Psense amplifier control line (e.g., an activation signal ACT), which may provide a supply voltage (e.g., an array voltage VARY) at an active "high" level. The second type of transistors 312, 313 may be coupled to an Nsense amplifier control line (e.g., a Row Nsense Latch signal RNL) that may provide a reference voltage (e.g., a ground (GND) voltage) at an active "low" level. The sense amplifier 300 may sense and amplify the data state applied to sense nodes 314, 315 through the digit (or bit) lines DL 320 and /DL 321, respectively. Nodes 316 and 317 that may be gut nodes coupled to drains of the second type of transistors 312, 313 may be coupled to the digit lines DL 320 and /DL 321 via isolation transistors 351 and 352. The isolation transistors 351 and 352 may be controlled by isolation signals ISO0 and ISO1. The digit lines DL 320 and /DL 321 (sense nodes 314 and 315) may be coupled to local input/output nodes A and B (LIOA/B) through the second type of transistors 361 and 362, respectively, which may be rendered conductive when a column select signal CS is active. LIOT and LIOB may correspond to the LIOT/B lines of FIG. 1, respectively.

The sense amplifier may further include additional second type of transistors 331, 332 may have drains coupled to the sense nodes 315 and 314 and sources coupled to both the gut nodes 316 and 317 and the drains of the second type of transistors 312 and 313. Gates of the second types of transistors 331, 332 may receive a bit line compensation signal AABLCP and may provide voltage compensation for voltage threshold imbalance between the second type of transistors 312 and 313. The sense amplifier 300 may further include transistors 318, 319, where the transistor 318 may couple the gut node 316 to a global power bus 350 and the transistor 319 may couple the gut node 316 to the gut node 317. The global power bus 350 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 318 and 319 may couple the global power bus 350 to the gut nodes 316 and 317 responsive to equilibrating signals AAGTEQ and AABLEQ provided on gates of the transistors 318 and 319.

In operation, the sense amplifier 300 may be configured to sense a data state of a coupled memory cell on the data lines DL 320 and /DL 321 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include several phases, such as an initial or standby phase, a compensation phase, a gut equalize phase, and a sense phase.

Figure 4:
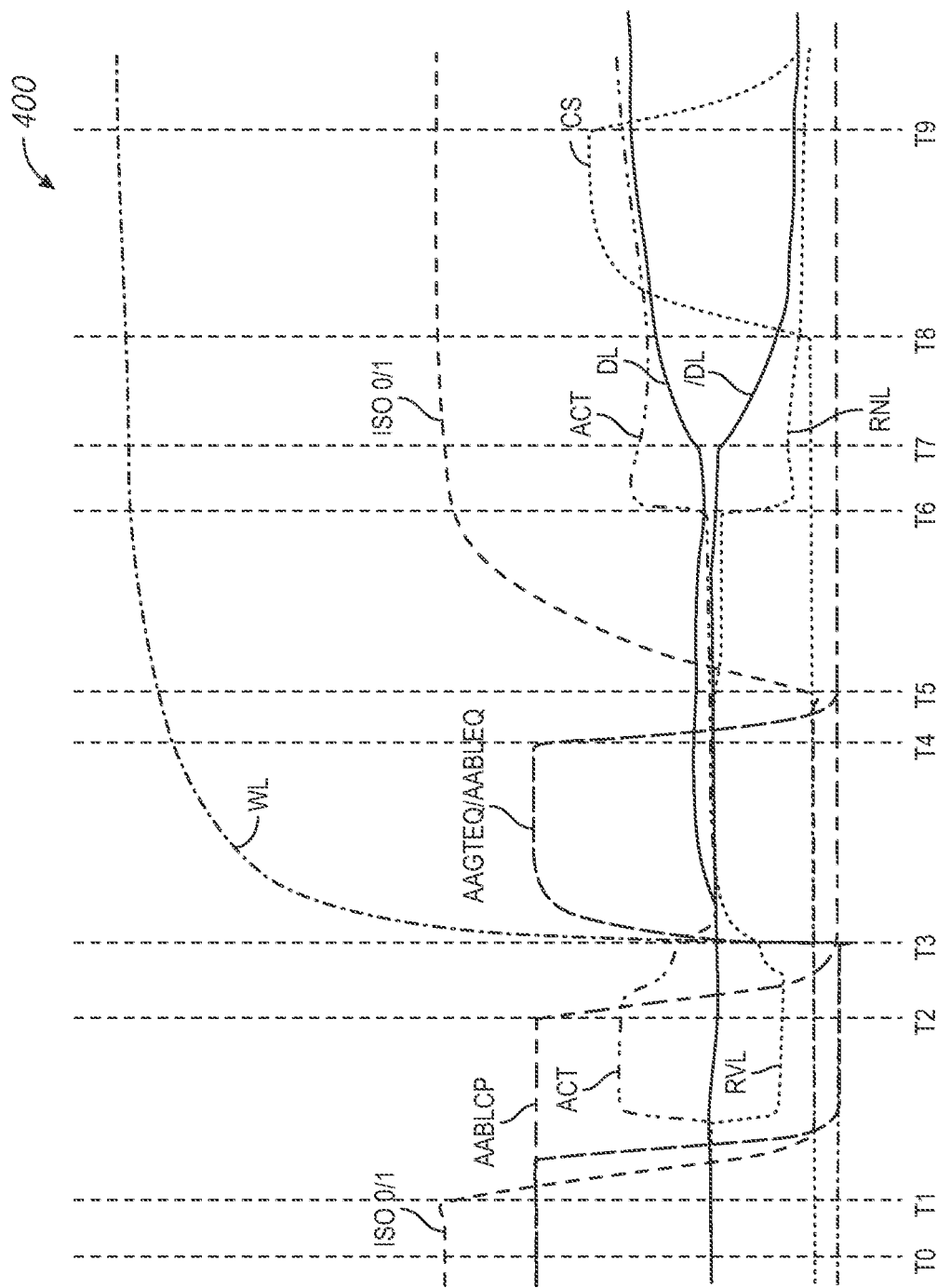
FIG. 4 is an exemplary timing diagram depicting operation of a sense amplifier in accordance with embodiments of the disclosure.

FIG. 4 is an illustration of an exemplary timing diagram 400 depicting signal transition during a sense operation using the sense amplifier 300 in accordance with an embodiment of the disclosure. During the initial phase (e.g., between times T0 and T1 of the timing diagram 400 of FIG. 4), the gut nodes 316 and 317 may be precharged to the VPCH voltage. For example, the global power bus 350 may be supplied with the VPCH voltage and the AABLCP signal, the ISO0/ISO1 signals, and the AAGTEQ and AABLEQ signals may be in their active states, respectively. Accordingly, while in the initial phase, each of the digit lines DL 320 and /DL 321, the sense nodes 314 and 315 and the gut nodes 316 and 317 may be precharged to the precharge voltage VPCH. In some examples, the VPCH voltage may be the VBLP voltage. The VBLP voltage may be approximately 0.5 of the VARY voltage.

After the initial phase, the sense amplifier 300 may enter the threshold voltage compensation phase (e.g., to perform a threshold voltage compensation operation) (e.g., between times T1 and T2 of the timing diagram 400 of FIG. 4), where voltages on the data lines DL 320 and /DL 321 are biased from the VPCH voltage (e.g., VBLP voltage) to compensate (e.g., provide threshold voltage compensation) for threshold voltage differences between the transistors 312, 313. During the compensation phase, at time T1, the ISO0 and ISO1 signals and the AAGTEQ and AABLEQ signals may be set to respective inactive state to disable the transistors 351, 352, 318 and 319. The AABLCP signal may remain in an active state to enable the transistors 331 and 332 to couple the nodes 314 and 315 to the gut nodes 317 and 316, respectively. Additionally, the drain and the gate of the transistor 312 may be coupled and the drain and the gate of the transistor 313 may be coupled. At time T2, the compensation phase may be completed by transitioning the AABLCP signal may to an inactive state, which disables the transistors 331 and 332 and decouples the nodes 314 and 315 from the gut nodes 317 and 316, respectively.

During the gut equalize phase (e.g., between times T3 and T4 of the timing diagram 400 of FIG. 4), the gut nodes 317 and 316 may be decoupled from the digit lines DL 320 and /DL 321 and may be coupled to each other to equalize voltages between the gut nodes 316, 317 to the VPCH voltage. During this phase, at time T3, the AAGTEQ and AABLEQ signals may transition to an active state. While the AABLCP signal is set to the inactive state, the transistors 332 and 331 may decouple the nodes 314 and 315 from the gut nodes 317 and 316. While the equilibrating signals AAGTEQ and AABLEQ are set to the active state, the transistors 318 and 319 may couple the VPCH voltage from the global power bus 350 to the gut nodes 316, 317. While the ISO0 and ISO1 signals are set to the inactive state, the isolation transistors 351 and 352 may decouple the gut nodes 317 and 316 from the digit lines DL 320 and /DL 321. After the to the gut nodes 316 and 317 are precharged to the VPCH voltage, the AAGTEQ and AABLEQ signals may be set to inactive states to disable the transistors 318 and 319 at time T4. Also during the gut equalization phase, at time T3, a wordline WL (e.g., any of the wordlines WL 260(0)-(N) or the wordlines WL 261(0)-(N) of FIG. 2) associated with the sense operation may be set to an active state. In some other examples, the wordline WL may be activated during the threshold voltage compensation phase.

During the sense phase (e.g., between times T5 and T8 of the timing diagram 400 of FIG. 4), the sense amplifier 300 may sense a data state of memory cell coupled to the data line DL 320 or /DL 321. At time T5, the ISO0 and ISO1 isolation signals may be set to an active state. At time T7, the ACT signal and the RNL signal may be activated and set to the logic high level (e.g., the VARY voltage) and the logic low level (e.g., the GND voltage), respectively. Responsive to the ISO0 and ISO1 isolation signals transitioning to the active state, the ISO transistor 351 may couple the digit line DL 320 to the gut node 316 and the ISO transistor 352 may couple the digit line /DL 321 to the gut node 317. During the sense phase, sense and amplify operations are then performed with the threshold voltage compensation voltage to balance the responses of the second type of transistors 312 and 313. For example, in response to a memory cell (e.g., one of the memory cells 240(0)-(N) or memory cells 241(0)-(N) of FIG. 2) being coupled to a digit line DL 320 or /DL 321 through its respective access device (e.g., the respective access device 250(0)-(N) or access device 251(0)-(N) of FIG. 2), a voltage difference is created between the digit lines DL 320 and /DL 321 (e.g., via the guts nodes 316 and 317). Thus, at time T7, the voltage difference is sensed by the second type of transistors 312, 313 as the sources of the second type of transistors 312, 313 begin to be pulled to ground through fully activated RNL signal, and one of the second type of transistors 312, 313 with a gate coupled to the digit line DL 320 or /DL 321 with the slightly higher voltage begins conducting. When a memory cell coupled to the gut node 316 through the digit line DL 320 stores a high data state, for example, the transistor 313 may begin conducting. Additionally, the other transistor 312 may become less conductive as the voltage of the gut node 317 with the slightly lower voltage decreases through the conducting transistor 313. Thus, the slightly higher and lower voltages are amplified to logic high and logic low voltages while the isolation signals ISO0 and ISO1 in the active state.

After the data state of the memory cell is sensed, and the sense nodes 314, 315 are each pulled to a respective one of the ACT signal and RNL signal voltages, a read may be performed in response to a READ command. For example, at time T8, the CS signal may be activated (e.g., in response to the READ command), the digit lines DL 320 and /DL 321 (e.g., at sense nodes 314 and 315) may be coupled to the LIO nodes (LIOT and LIOB) and the data output may be provided to the LIO nodes. Thus, the data may be read out from the LIO nodes. After a read operation is completed, at time T9, the CS signal may be set to an inactive state.

In some examples, a memory may be placed into the active power-down state. An active power-down state is a power-down state entered when at least one wordline WL (e.g., any of the wordlines WL 260(0)-(N) or the wordlines WL 261(0)-(N) of FIG. 2) is set to and remains at an active state during the power-down. The active-power-down state may be entered after receipt of an ACT signal and may be in response to a NOP command or a command inhibit instruction, and may be initiated any time the wordline WL is set to an active state, such as during the gut equalization phase (e.g., between times T0 and T2 of the timing diagram 400 of FIG. 4), the sense phase (e.g., between times T3 and T6 of the timing diagram 400 of FIG. 4), or any other time the wordline WL is set to an active state. When a wordline WL is set to an active state, a memory cell is coupled to a respective digit line DL 320 or /DL 321 through its respective access device (e.g., the respective access device 250(0)-(N) or access device 251(0)-(N) of FIG. 2). In response to the memory cell being coupled to a respective digit line DL 320 or /DL 321, a voltage differential is created between the digit lines DL 320 and /DL 321 via the sense amplifier 300 such that one of the digit lines DL 320 or /DL 321 is set to a high voltage.

Therefore, while in the active power state, at least one of the digit lines DL 320 and /DL 321 may float at a voltage approximately equal to the VARY voltage and the other will float at a low voltage defined by the RNL voltage, such as a ground or reference voltage. The advantage of allowing one of the digit lines DL 320 and /DL 321 to float at a voltage approximately equal the VARY voltage is that recovery to provision of high logical data values (e.g., 1's) upon transition back to normal operation is faster (e.g., based on reduction of a delay in charge the digit lines DL 320 and /DL 321). However, a high voltage one of the digit lines DL 320 and /DL 321 may cause high voltage differentials across transistors of the sense amplifier 300, which may result in leakage current through some transistors of the sense amplifier 300. The leakage current through transistors of the amplifier 300 may consume extra power while in the active power-down state. This additional power consumption caused by leakage current across thousands of sense amplifiers in a memory may be substantial.

To reduce leakage current, the sense amplifier 300 may be set to a state that electrically isolates portions of the sense amplifier 300 from the higher voltage of the digit lines DL 320 and /DL 321. In one example, in response to entering the active power-down state, the ISO0 and ISO1 isolation signals may transition to an inactive state. In response to the ISO0 and ISO1 signals transitioning to the inactive state, the isolation transistors 351 and 352 may be disabled. Disabling the isolation transistors 351 and 352 may decouple the gut nodes 317 and 316 from the digit lines DL 320 and /DL 321. This decoupling may reduce leakage current through the transistors of the sense amplifier.

In another example, in response to entering the active power-down state, the voltage of the RNL signal may be increased to a voltage greater than the reference voltage. In some examples, the voltage of the RNL signal may be increased to a voltage between and including 0.1 and half of the Vary voltage. In a particular example, the voltage of the RNL signal may be increased to 0.2 volts. Increasing the voltage of the RNL signal may reduce a voltage differential between the gut nodes 317 and 316. Reducing the voltage differential between the gut nodes 317 and 316 may reduce voltage differentials across at least some of the transistors of the sense amplifier 300, which may also result in reduced leakage current within the sense amplifier 300. In some examples, in response to entering the active power-down state, the ISO0 and ISO1 isolation signals transitioning to an inactive state may be combined with increasing the voltage of the RNL signal to achieve the benefits of both approaches, thereby reducing overall IDD3P current consumption. It is noted that the actions of isolating the digit lines DL 320 and /DL 321 from the gut nodes 316 and 317 of the sense amplifier 300 and/or increasing the RNL signal voltage provided to the sense amplifier 300 may also be performed during in an active standby mode to reduce some of the IDD3N current caused by leakage in the sense amplifier 300 without departing from the scope of the disclosure.

Figure 5:
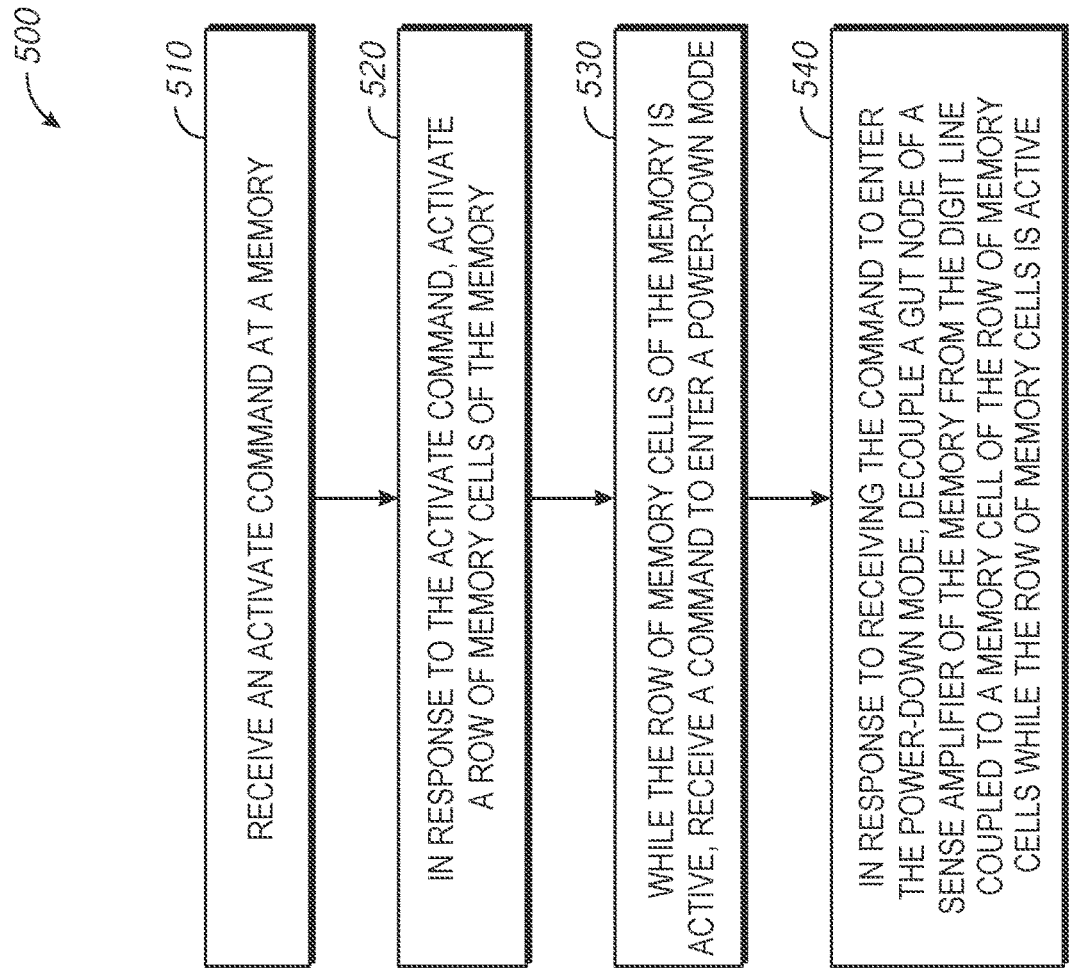
FIG. 5 is a flow diagram of a method for entering an active power-down mode in accordance with embodiments of the disclosure.

FIG. 5 is a flow diagram of a method 500 for entering an active power-down mode in accordance with embodiments of the disclosure. The method 500, all or in part, may be performed by the semiconductor device 100, a decoder circuit (e.g., any of the command decoder 125, the row decoder 130, the column decoder 140, any control circuitry of the memory cell array 145 of the memory banks BANK0-N, or any combination thereof), and/or the sense amplifiers 150 of FIG. 1, the sense amplifier 210 of FIG. 2, the sense amplifier 300 of FIG. 3, or combinations thereof.

The method 500 receiving an activate command at a memory, at 510. The activate command may be received via a command and address bus, such as the command address bus 110 of FIG. 1. The activate command may be decoded at a command decoder, such as the command decoder 125 of FIG. 1. The method 500 may further include, in response to the activate command, activating a row of memory cells of the memory, at 520. Activation of the row of memory may occur during a sensing operation, such as during the gut equalization phase described with reference to FIGS. 3 and 4.

The method 500 may further include, while the row of memory cells of the memory is active, receive a command to enter a power-down mode, at 530. The row of memory cells may include the memory cell depicted in FIG. 1 or any of the memory cells 240(0)-(N) or 241(0)-(N) of FIG. 2. The command to enter a power-down mode may include a NOP command or a command inhibit instruction. The power-down mode may be an active power-down mode (e.g., or an active standby mode) based on the row of memory cells being active. The row of memory cells may be active based on a corresponding wordline WL being active, such as the wordline WL of FIG. 1 or the wordlines WL 260(0)-(N) or 261(0)-(N) of FIG. 2. While the wordline is active, the memory cell may be coupled to a digit line, such as any of the BL or /BL of FIG. 1, the digit lines DL 220 or /DL 221 of FIG. 2, or the digit lines DL 320 or /DL 321 of FIG. 3 via an access device, such as any of the access devices 250(0)-(N) or 251(0)-(N) of FIG. 2.

The method 500 may further include, in response to receiving the command to enter the power-down mode, decoupling a gut node of a sense amplifier of the memory from the digit line coupled to a memory cell of the row of memory cells while the row of memory cells is active, at 540. The gut node may include one of the gut nodes 316 or 317 of FIG. 3. In some examples, decoupling the gut node of the sense amplifier of the memory from the digit line coupled to the memory cell of the row of memory cells may include disabling a transistor coupled between the gut node and the digit line. The transistor may include one of the transistors 351 or 352 of FIG. 3, in some examples. In some examples, the method 500 may further include increasing a voltage of a row Nsense Latch (RNL) signal (e.g., the RNL signal of FIG. 3) in response to entering the power-down mode. In some examples, the voltage of the RNL signal may be increased to a voltage between 0.1 and half of the Vary voltage. In a specific example, the voltage of the RNL signal may be increased to 0.2 volts. By decoupling the digit line from the gut node and/or increasing the voltage of the RNL signal, leakage current through the sense amplifier may be reduced during the active power-down mode.

Figure 6:
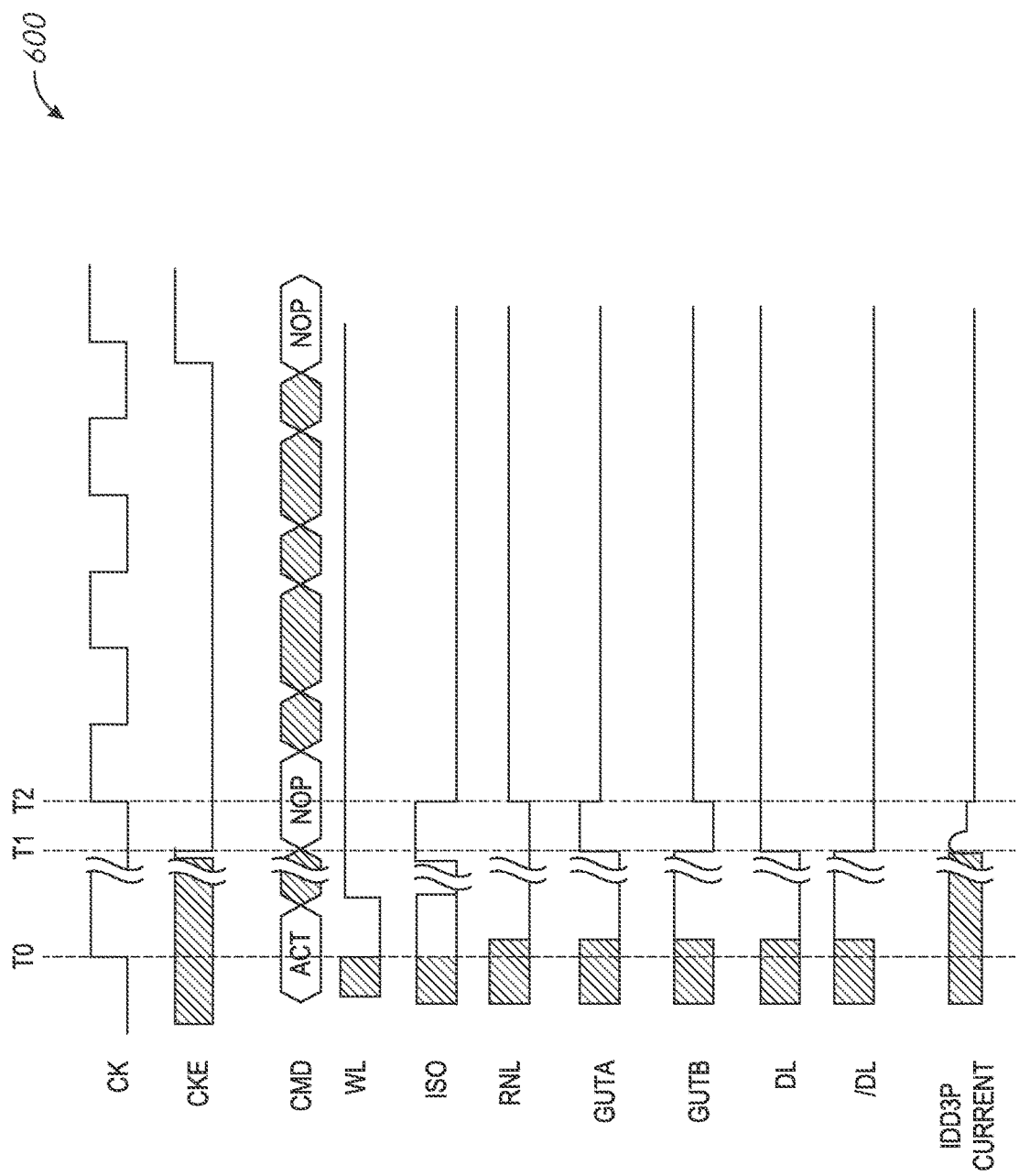
FIG. 6 is an exemplary timing diagram depicting operation of a sense amplifier while in an active power-down mode in accordance with embodiments of the disclosure.

FIG. 6 is an illustration of an exemplary timing diagram 600 depicting transition to an active power-down state in accordance with embodiments of the disclosure. In some examples, the timing diagram 600 may depict operation of the semiconductor device 100 and/or one of the sense amplifiers 150 of FIG. 1, the sense amplifier 210 of FIG. 2, the sense amplifier 300 of FIG. 3, or combinations thereof, during transition to an active power-down state. The CK and CKE signals may correspond to the CK and CKE signals of FIG. 1. The CMD signal may correspond to a command signal received at via the command and address bus 110 of FIG. 1. The WL signal may correspond to signals transmitted on the wordlines WL of FIG. 1, the wordlines WL 260(0)-(N) and wordlines WL 261(0)-(N) of FIG. 2. The GUTA and GUTB signals may correspond to voltages at the gut nodes 317 and 316 of FIG. 3. The ISO signal may correspond to the ISO0 and ISO1 isolation signals of FIG. 3. The RNL signal may correspond to the RNL signal of FIG. 3. The IDD3P current may correspond to the active power-down current.

At time T0, while the clock enable signal CKE is active, an ACT command may be received via the CMD signal responsive to the clock signal CK. In response to the ACT command, the WL, ISO, GUTA, GUTB, RNL, DL, and /DL signals may transition during a sense operation to sense data values stored in a memory cell coupled to the digit line DL or /DL in response to the WL being activated.

At time T1, the CKE signal may transition to an inactive state (e.g., to disable clock signals) and a NOP command (e.g., or a command inhibit instruction) may be received via the CMD signal, which may initiate a power-down mode. Based on the previously received ACT command, the power-down mode may be an active power-down mode (e.g., because the wordline WL is in an active state based on the ACT command).

At time T2, the ISO signal may transition to an inactive state and the RNL signal may transition to a voltage greater than a reference voltage, in response to entry into the power-down mode (e.g., based on the CKE signal being set to the inactive state and/or receipt of the NOP command) In response to the ISO signal transitioning to the inactive state, isolation transistors (e.g., the isolation transistors 351 and 352) may be disabled, decoupling the digit lines DL and /DL from the gut nodes. Increasing the voltage of the RNL signal may reduce a voltage differential between the gut nodes 317 and 316. In an example, the RNL signal may transition to a voltage up to half of the Vary voltage. In a specific example, the RNL signal may transition to a voltage of 0.2 volts. In response to transition of the RNL signal to a voltage greater than a reference voltage, a voltage differential between the GUTA and GUTB signals may be reduced. The reduction in differential between the GUTA and GUTB signals may be based on magnitude increase in the voltage of the RNL signal. In some examples, the changes to the voltage differentials between the GUTA and GUTB signals may be equal to a magnitude increase of the voltage of the RNL signal. In response to the transition of the ISO signal to an inactive state and transition of the voltage of the RNL signal, the IDD3P current may be reduced based on a reduction of leakage current through the sense amplifier.

Figure 7:
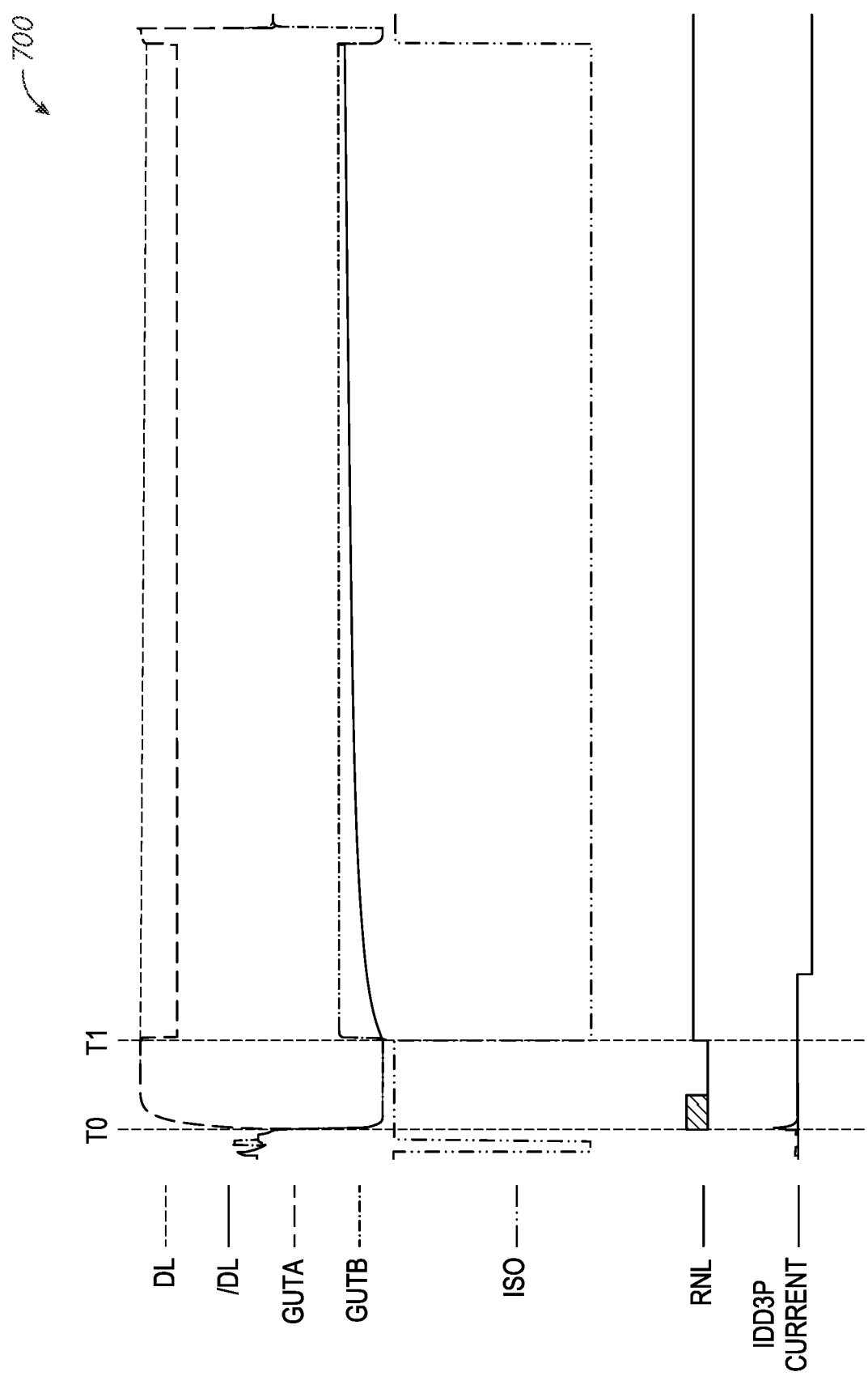
FIG. 7 is an exemplary timing diagram depicting operation of a sense amplifier while in an active power-down mode in accordance with embodiments of the disclosure.

FIG. 7 is an illustration of an exemplary timing diagram 700 depicting transition to an active power-down state in accordance with embodiments of the disclosure. In some examples, the timing diagram 700 may depict operation of one of the sense amplifiers 150 of FIG. 1, the sense amplifier 210 of FIG. 2, the sense amplifier 300 of FIG. 3, or combinations thereof, during transition to an active power-down state. The DL signal and the /DL signals may correspond to signals transmitted on the digit lines BL and /BL of FIG. 1, the digit lines DL 220 and /DL 221 of FIG. 2, and/or the digit lines DL 320 and /DL 321 of FIG. 3. The GUTA and GUTB signals may correspond to voltages at the gut nodes 317 and 316 of FIG. 3. The ISO signal may correspond to the ISO0 and ISO1 isolation signals of FIG. 3. The RNL signal may correspond to the RNL signal of FIG. 3.

Prior to or at time T0, an ACT command may be received, which may cause a wordline WL to be set to an active state. The sense amplifier may perform a sense operation prior to time T0 in response to the ISO signal (e.g., and other signals described with reference to FIGS. 3 and 4). At time T0, the wordline WL designated by the ACT command may be set to an active state and the ISO signal may transition high, which may cause the DL signal may to transition to an active state (e.g., based on a value in a corresponding memory cell coupled to the active wordline WL) and the /DL signal to transition to an inactive state in response to the DL signal transitioning to the active state. Just prior to time T1, an active power-down command (e.g., a NOP command and clearing of a clock enable signal CKE) may be received (not shown). At time T1, in response to the active power-down command, the ISO signal may transition to an inactive. Additionally, the RNL signal may transition to a voltage greater than a ground voltage. In response to the ISO signal transitioning to the inactive state, isolation transistors (e.g., the isolation transistors 351 and 352) may be disabled, decoupling the digit lines DL and /DL from the gut nodes (e.g., GUTA and GUTB signals). In response, the GUTA and GUTB signals may transition to a voltage differential based on the voltage increase in the RNL signal. As shown in the timing diagram 700, the leakage current IDD3P current may be reduced in response to transition of the ISO signal and increase of a voltage of the RNL signal after entry into the active power-down mode.

The timing diagrams 400, 600, and 700 are exemplary for illustrating operation of various described embodiments. Although the timing diagrams 400, 600, and 700 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 400, 600, and 700 are not intended to be to scale, and the representative timing is an illustrative example of a timing characteristics.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a sense amplifier comprising of a transistor coupled between a digit line and a gut node of the sense amplifier, wherein, while a wordline coupled to a memory cell is activated, in response to entering a power-down mode, the transistor is disabled to decouple a digit line coupled to the memory cell from the gut node.

2. The apparatus of claim 1, further comprising a decoder circuit configured to cause the first transistor to be disabled.

3. The apparatus of claim 1, wherein the sense amplifier is configured to receive a latch voltage in response to entering the power-down mode.

4. The apparatus of claim 3, wherein the latch voltage is greater than a reference voltage.

5. The apparatus of claim 3, wherein the latch voltage has a value between 0 volts and half of a voltage provided to the sense amplifier during a sense operation.

6. The apparatus of claim 1, wherein, prior to activation of the wordline, the sense amplifier is configured to perform a threshold voltage compensation operation to precharge the digit line based on threshold voltages differences between two transistor of the sense amplifier.

7. The apparatus of claim 1, wherein the power-down mode is an active power-down mode or active standby mode.

8. An apparatus comprising:
   a sense amplifier comprising a gut node and a transistor coupled between a digit line and a first gut node of the sense amplifier, wherein the digit line is coupled to a memory cell; and
   a decoder circuit coupled to the sense amplifier, wherein the decoder circuit is configured to, in response to entering a power-down mode and while a wordline coupled to the memory cell is activated, disable the transistor to decouple the digit line from the gut node.

9. The apparatus of claim 8, wherein the decoder circuit is further configured to activate the wordline based on a received activation command.

10. The apparatus of claim 8, wherein the decoder circuit is further configured to cause a first latch voltage to be provided to the sense amplifier in response to entering the power-down mode.

11. The apparatus of claim 10, wherein the latch voltage is greater than a reference voltage.

12. The apparatus of claim 11, wherein the sense amplifier further comprises a pair of cross-coupled transistors configured to receive the latch voltage at respective sources, wherein a gate of one of the pair of cross-coupled transistors is coupled to the digit line.

13. The apparatus of claim 12, wherein, prior to activation of the wordline, the decoder is configured to cause the sense amplifier to perform a threshold voltage compensation operation to precharge the digit line based on threshold voltage differences between the pair of transistors.

14. The apparatus of claim 8, wherein the decoder circuit is further configured to, in response to entering the power-down mode and while the wordline coupled to the memory cell is activated, disable a second transistor of the sense amplifier to decouple a second digit line from a second gut node of the sense amplifier.

15. The apparatus of claim 8, wherein, prior to activation of the wordline, the sense amplifier is configured to perform a threshold voltage compensation operation to precharge the digit line based on threshold differences between two transistor of the sense amplifier.

16. The apparatus of claim 8, wherein the memory is configured to enter the power-down mode in response to receipt of a no operation (NOP) or a deselect command.

17. A method, comprising:
   while a row of memory cells of a memory is active based on an activate command, receiving a command to enter a power-down mode; and
   in response to entering the power-down mode based on the command, increasing a voltage of a row N sense Latch (RNL) signal provided to a node of a sense amplifier coupled to a memory cell of the row of memory cells.

18. The method of claim 17, further comprising increasing the voltage of the RNL signal latch signal to a voltage greater than a reference voltage.

19. The method of claim 17, further comprising, prior to activation of the row of memory cells, causing the sense amplifier to perform a threshold voltage compensation operation to precharge a digit line coupled to the sense amplifier to a voltage based on threshold voltage differences between a pair of transistors coupled to the first node.

20. The method of claim 17, further comprising while the row of memory cells are activated and in response to entering the power-down mode, decoupling a digit line coupled to a memory cell of the row of memory cells from a gut node of the sense amplifier.

* * * * *